(12) United States Patent
Kamikura et al.

(10) Patent No.: US 10,177,674 B2
(45) Date of Patent: Jan. 8, 2019

(54) POWER CIRCUIT DEVICE

(71) Applicant: Mitsubishi Electric Corporation, Chiyoda-ku (JP)

(72) Inventors: Mamoru Kamikura, Chiyoda-ku (JP); Kodai Katagiri, Chiyoda-ku (JP); Keita Takahashi, Chiyoda-ku (JP); Norihiko Akashi, Chiyoda-ku (JP); Nobuyuki Haruna, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/546,712

(22) PCT Filed: Nov. 30, 2015

(86) PCT No.: PCT/JP2015/083578
§ 371 (c)(1),
(2) Date: Jul. 27, 2017

(87) PCT Pub. No.: WO2016/147492
PCT Pub. Date: Sep. 22, 2016

(65) Prior Publication Data
US 2018/0007785 A1    Jan. 4, 2018

(30) Foreign Application Priority Data

Mar. 16, 2015  (JP) ................. 2015-051673

(51) Int. Cl.
*H02M 5/458*    (2006.01)
*H02M 7/48*     (2007.01)
(Continued)

(52) U.S. Cl.
CPC ............. *H02M 5/458* (2013.01); *H02M 1/44* (2013.01); *H02M 7/48* (2013.01); *H05K 1/0218* (2013.01);
(Continued)

(58) Field of Classification Search
CPC .... H02M 5/458; H02M 7/003; H05K 1/0216; H05K 1/0218; H05K 1/0227;
(Continued)

(56) References Cited

U.S. PATENT DOCUMENTS 6,583,682 B1 *  6/2003  Dubhashi ................ H02M 1/12
                                                      333/12
9,148,946 B1 *  9/2015  Singh ..................... H05K 1/021
(Continued)

FOREIGN PATENT DOCUMENTS

JP    2000-341951 A    12/2000
JP    2005-287157 A    10/2005
(Continued)

OTHER PUBLICATIONS

International Search Report dated Feb. 2, 2016 in PCT/JP2015/083578 filed Nov. 30, 2015.
European Search Report dated Oct. 12, 2018 in EP Application No. 15885584.1.

*Primary Examiner* — Fred E Finch, III
(74) *Attorney, Agent, or Firm* — Oblon, McClelland, Maier & Neustadt, L.L.P.

(57) ABSTRACT

Even when a grounding capacitor is included at either end of a common mode coil, there is noise that flows from a load into a metal frame, and there is a need to restrict an amount of noise propagating to a system power supply. Because of this, a noise loop is formed of a rectifier circuit, an inverter, a first electrical wire that connects a positive polarity side of the rectifier circuit and the inverter, a second electrical wire that connects a negative polarity side of the rectifier circuit and the inverter, a ground wire terminal that can connect a load connected to an output terminal or the inverter, and a conductive plate that connects at least one or the first electrical wire and second electrical wire and the ground wire terminal.

6 Claims, 10 Drawing Sheets

(51) Int. Cl.
  *H02M 1/44* (2007.01)
  *H02M 7/00* (2006.01)
  *H05K 1/02* (2006.01)
  *H05K 1/11* (2006.01)

(52) U.S. Cl.
  CPC ......... *H05K 1/0227* (2013.01); *H05K 1/0231* (2013.01); *H02M 7/003* (2013.01); *H05K 1/0204* (2013.01); *H05K 1/115* (2013.01)

(58) Field of Classification Search
  CPC .. H05K 1/0231; H05K 1/0233; H05K 1/0204; H05K 1/115
  See application file for complete search history.

(56) References Cited

U.S. PATENT DOCUMENTS

| | | | |
|---|---|---|---|
| 2005/0174820 A1* | 8/2005 | Mutoh | H02M 1/44 363/144 |
| 2008/0303469 A1* | 12/2008 | Nojima | H02M 7/003 318/503 |
| 2017/0079132 A1* | 3/2017 | Bayerer | H02M 1/44 |

FOREIGN PATENT DOCUMENTS

| | | |
|---|---|---|
| JP | 2006-115649 A | 4/2006 |
| JP | 2010-007974 A | 1/2010 |
| JP | 2014-50260 A | 3/2014 |
| JP | 2014-225965 A | 12/2014 |

\* cited by examiner

POWER CIRCUIT DEVICE

TECHNICAL FIELD

The present invention relates to a power circuit device including an inverter that converts alternating current input from a system power supply into direct current, and subsequently into alternating current again.

BACKGROUND ART

Generally, electronic equipment generates electrical noise, and equipment for which a countermeasure is insufficient is a factor in causing various problems. In particular, electrical equipment that operates on an alternating current power supply is often connected via a shared power supply line, and may experience a malfunction due to noise generated in other electrical equipment, or conversely, cause another device to malfunction due to noise generated in a device of the equipment itself.

As a source of noise, there is a slight electrical discharge in an electrical switch and various kinds of motor caused by a semiconductor such as an inverter, and the like, and weakening of energy generated in the source of noise, and causing transmission in a noise, transmission path to be difficult, are carried out as noise countermeasures.

Noise propagation is divided into two kinds depending on a transmission method thereof, wherein the first is normal mode noise generated between signal lines and between power supply lines, and is a noise component that is generated between power supply paths and flows in the same direction as a power supply current or signal. As noise current directions in the normal mode are of opposite orientations when going and returning, noise components are cancelled out and decrease, because of which there is little radiation noise, and this noise is countered by using filters in signal lines and power supply lines. The second is common mode noise generated between a signal line or power supply line and a ground, and this noise flows in the same direction to a signal pattern and SG (signal ground), passes through a metal frame, and returns to a signal source through a floating capacitance or the like.

Noise in the common mode is such that a large power supply loop is formed, which is important as a noise countermeasure as a large noise is radiated with even a small noise current. In response to this noise, filters are used between positive and negative signal lines and positive and negative power supply lines.

Patent Document 1 proposes a power circuit device that converts alternating current input from a system power supply into direct current, and subsequently into alternating current again, wherein, as a countermeasure for common mode noise, particularly in order to restrict radiation noise, a conductive plate is provided so that a common mode noise current is not caused to flow directly into a metal frame, the conductive plate and a bypass capacitor of a circuit configuring a power supply circuit are connected, and by the common mode noise current being taken in and connected to one point on the metal frame via an inductor, radiation noise is prevented from exiting directly from the metal frame.

Also, Patent Document 2 proposes using impedance elements to connect first and second radiators provided respectively in a first converter that converts alternating current into direct current and a second converter that converts direct current into alternating current, and reducing a wave height value of a common mode noise current by arranging that the common mode noise current always flows through the impedance elements.

CITATION LIST

Patent Literature

Patent Document 1: JP-A-2000-341951
Patent Document 2: JP-A-2006-115649

SUMMARY OF INVENTION

Technical Problem

A switching power supply device shown in Patent Document 1 is such that, even when attempting to increase an amount of attenuation by including a grounding capacitor at either and (a rectifier circuit side and a system power supply side) of a common mode coil in response to a common mode noise current flowing into a metal frame from a load connected via an inverter and electrical wire, a noise transmission path is formed of a rectifier circuit, the rectifier circuit side grounding capacitor of the grounding capacitors, a conductive plate, the system power supply side grounding capacitor of the grounding capacitors, a system power supply, a around, a metal frame, a floating capacitance between the metal frame and conductive plate, a bypass capacitor, and the rectifier circuit, without passing through the common mode coil, and there is a problem in that the advantage of attenuating the amount of noise propagating is not as expected.

Also, a power conversion device shown in Patent Document 2 is such that causing noise to flow into a radiator for cooling a semiconductor module without causing noise to flow into a metal frame is proposed, but when a radiator is used, a new propagation path is formed due to a semiconductor module connected to the radiator and parasitic capacitance of the radiator, and the noise propagation path becomes complex, because of which there is a problem in that attenuating noise is difficult.

The invention, having been contrived in order to resolve the heretofore described kinds of problem, has an object of providing a power circuit device such that the amount of noise flowing into a metal frame from a load that propagates to a system power supply can be restricted, even when a grounding capacitor is included at either end of a common mode coil.

Solution to Problem

A power circuit device according to the invention includes a rectifier circuit, an inverter, a common mode coil provided on an input side of the rectifier circuit, a first electrical wire that connects the common mode coil, a positive polarity side of the rectifier circuit and the inverter, a second electrical wire that connects the common mode coil, a negative polarity side of the rectifier circuit and the inverter, a conductive plate, a bypass capacitor connected between the first electrical wire and second electrical wire and the conductive plate, a ground wire terminal that can connect a load connected to an output terminal of the inverter to a ground potential, and a metal frame, wherein the metal frame is divided into a first metal frame and a second metal frame, the first metal frame is connected to the conductive plate by an inductor or resistance, the second metal frame is connected to the ground wire terminal, and a noise loop is formed of at least one of the first electrical wire and second electrical wire, the bypass capacitor, the conductive plate, and the ground wire terminal.

Advantageous Effects of Invention

According to the invention, a common mode coil provided on an input side of a rectifying circuit and a metal frame are included, the metal frame is divided into a first metal frame and a second metal frame, the first metal frame is connected to the conductive body by an inductor or resistance, the second metal frame is connected to the ground wire terminal, and a noise loop is formed of the common mode coil, at least one of the first electrical wire, which connects the common mode coil, a positive polarity side of a rectifier circuit and the inverter, and a second electrical wire, which connects the common mode coil, a negative polarity side of the rectifier circuit and the inverter, the bypass capacitor, the conductive plate, and a ground wire terminal. Whereby noise propagating from the load propagates to the conductive plate through the ground wire terminal, and noise flowing from the load into a system power supply can be restricted.

DESCRIPTION OF EMBODIMENTS

First Embodiment

Hereafter, a first embodiment of the invention will be described.

Figure 1:
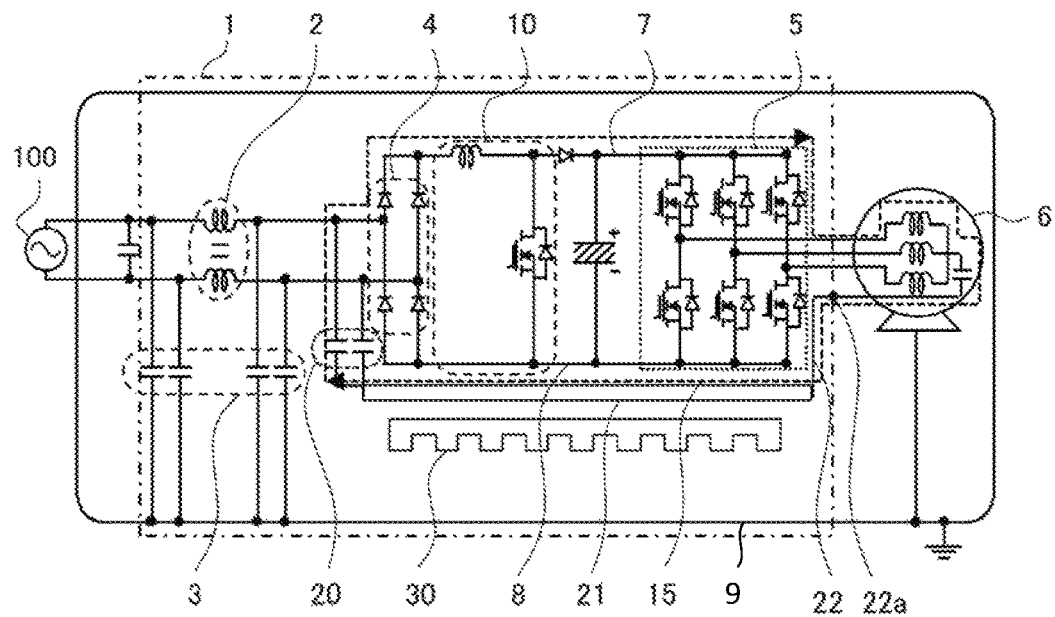
FIG. 1 is a circuit diagram of a power circuit device according to a first embodiment of the invention.
Figure 2:
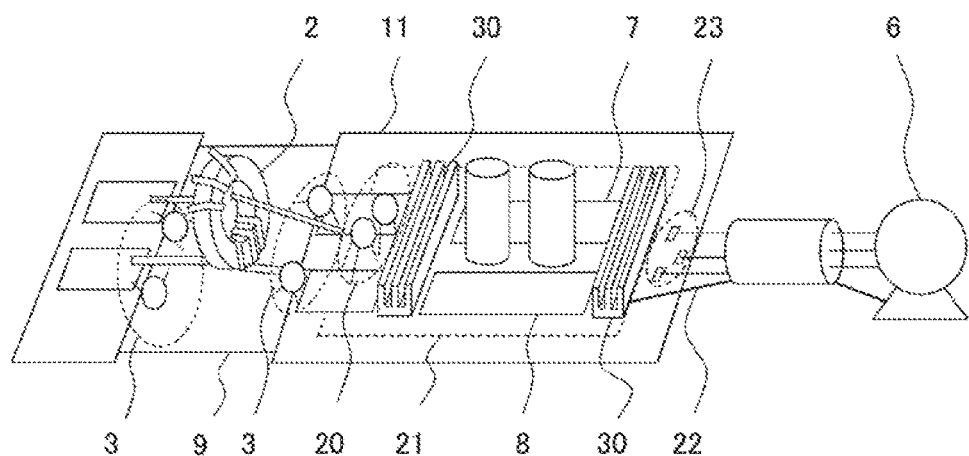
FIG. 2 is a perspective views of the power circuit device according to the first embodiment of the invention.
Figure 3:
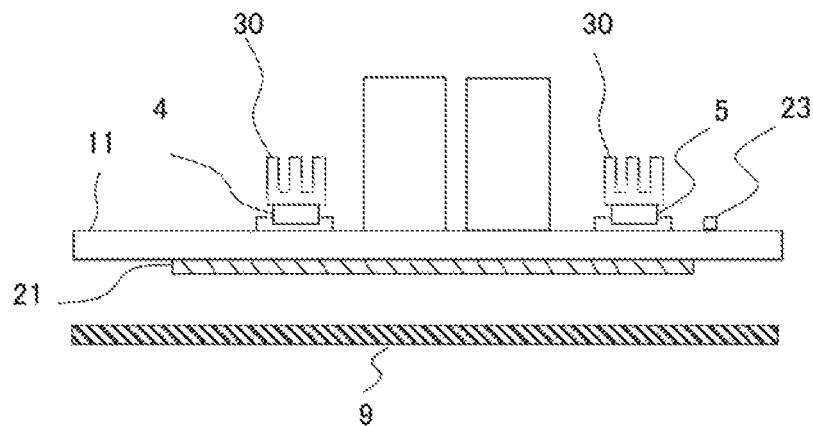
FIG. 3 is a side view of the power circuit device according to the first embodiment of the invention.

FIG. 1 is a circuit diagram showing a power circuit device 1 according to the first embodiment of the invention, wherein a system power supply 100 and load 6 connected to the power circuit device 1 are included in FIG. 1. FIG. 2 is a perspective view showing the power circuit device 1 according to the first embodiment of the invention, wherein the system power supply 100 is not shown. FIG. 3 is a side view of a rectifier circuit 4, step-up circuit 10, and inverter 5 portion of the power circuit device 1 according to the first embodiment of the invention.

As shown in FIG. 1, a grounding capacitor 3 is attached to either end of a common mode coil 2. An upper limit value of capacitance of the grounding capacitor 3, taking leakage current into account, is in the region of 4,700 pF. One common mode coil 2 is connected to the system-power supply 100, while another is connected to the rectifier circuit 4. The rectifier circuit 4 is connected to the step-up circuit 10, which is formed of an inductor, a semiconductor element, and a diode. The step-up circuit 10 is connected to the inverter 5 via an electrolytic capacitor. Positive polarity aides of the rectifier circuit 4, step-up circuit 10, and inverter 5 form a first wire 7, while negative polarity sides thereof form a second wire 8. In other words, the positive polarity side of the rectifier circuit 4 and the inverter 5 are connected by the first wire 7, while the negative polarity side of the rectifier circuit 4 and the inverter 5 are connected by the second wire 8.

Also, the load 6 is connected to an output wire 23 and ground wire terminal 22a of the power circuit device 1. Also, an electrical wire of the load 6 is connected to a metal frame 9 via floating capacitance. The metal frame 9 is a chassis included in the power circuit device 1, and the load 6 is shown as being mounted on top of the metal frame 9 in FIG. 1, but this is shown in order to express an electrical connection relationship with the load 6, and differs from an actual structure. A ground wire 22 is connected to a conductive plate 21, and the rectifier circuit 4 side of the common mode coil 2 and the conductive plate 21 are connected by a bypass capacitor 20 connected farther to the system power supply 100 side than the rectifier circuit 4.

According to this configuration, a noise loop 15 is formed from the rectifier circuit 4 by the first wire 7, including the step-up circuit 10, the inverter 5, output wire 23, load 6, ground wire terminal 22a, ground wire 22, conductive plate 21, and bypass capacitor 20.

A heatsink 30 is provided for heat release in the rectifier circuit 4 and inverter 5, and the heatsink 30 and conductive plate 21 are disposed one on either side surface of a printed circuit board 11 so as to sandwich the printed circuit board 11. Although the heat sink 30 is shown as being a single article in FIG. 1, a disposition may be such that one heatsink 30 is shared by the rectifier circuit 4 and inverter 5, or there may be individual heatsinks 30 for the rectifier circuit 4 and inverter 5.

According to this kind of configuration, noise flowing from the inverter 5 and step-up circuit 10 into the metal frame 9 via the floating capacitance of the load 6 is led to the conductive plate 21 by the noise loop 15, whereby the flow to the metal frame 9 can be reduced. Because of this, noise flowing from the load 6 into the metal frame 9 is restricted, and the amount of noise propagating to the system power supply 100 can be restricted. The noise loop 15 can be formed even when using a part with height, such as an electrolytic capacitor, and disposing the rectifier circuit 4 and inverter 5 on the same side as the electrolytic capacitor.

The noise loop 15 is formed of the inverter 5, an electrical wire connecting the inverter and load 6, the load 6, the floating capacitance of the load 6, the ground wire 22, the conductive plate 21, the bypass capacitor 20, the rectifier circuit 4, the step-up circuit 10, and the inverter 5. Although a loop that passes along the first wire 7 is shown in FIG. 1, the noise loop may be a loop that passes along the second wire 8.

By the power circuit device 1 being configured in this way, the noise loop 15, which can lead noise flowing from the inverter 5 and step-up circuit 10 into the metal frame 9 via the floating capacitance of the load 6, is provided when attempting to increase an amount of attenuation by a noise filter formed of the common mode coil 2 and grounding capacitor 3 by providing the grounding capacitor 3 at either end of the common mode coil 2, because of which the amount of noise flowing into the metal frame 9 via the floating capacitance of the load 6 that propagates to the system power supply 100 can be restricted.

A diagram of a state wherein the power circuit device 1 is enclosed by the metal frame 9 is shown in FIG. 1, but the metal frame 9 may be simply installed below the power circuit device 1, rather than enclosing the power circuit device 1.

Also, the ground wire 22 may be a shield of a shielded wire that links the power circuit device 1 and load 6. According to this configuration, the noise loop 15, which can collect noise flowing from the inverter 5 and step-up circuit 10 into the metal frame 9 via the floating capacitance of the load 6, is formed, and not only can the amount of noise flowing into the metal frame 9 via the floating capacitance of the load 6 that propagates to the system power supply 100 be restricted, but also noise radiating from a cable connecting the output wire 23 and load 6 can also be restricted.

Second Embodiment

Figure 4:
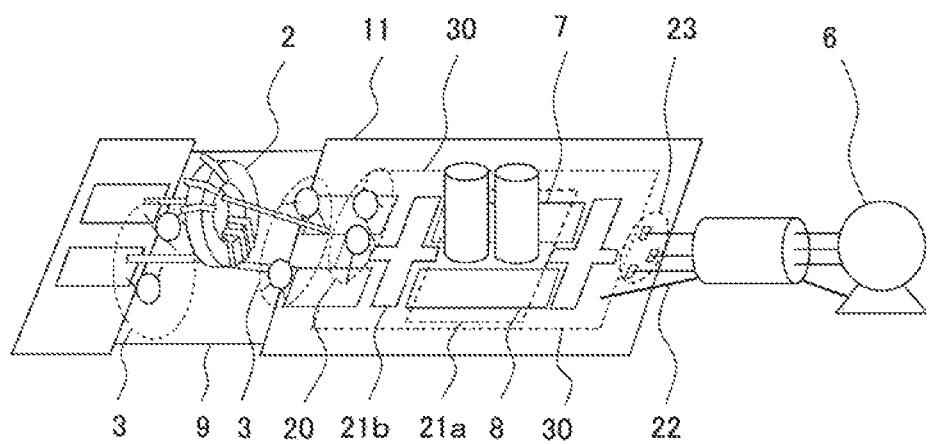
FIG. 4 is a perspective view of a power circuit device according to a second embodiment of the invention.
Figure 5:
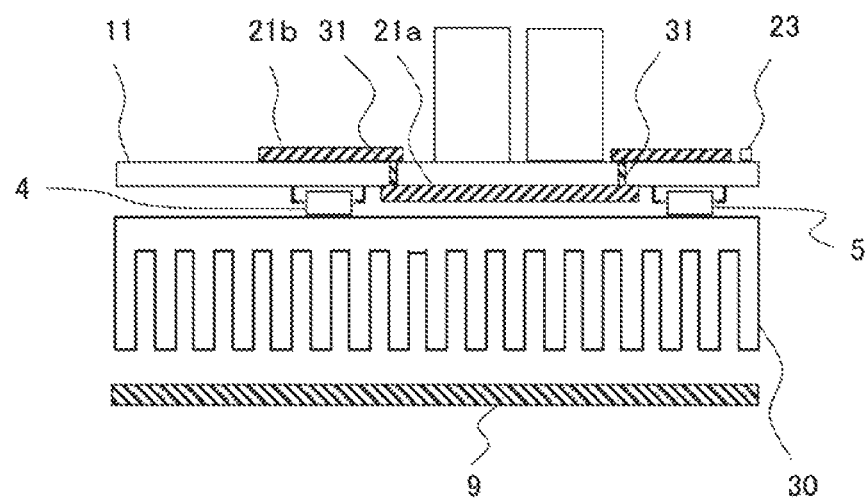
FIG. 5 is a side view of the power circuit device according to the second embodiment of the invention.

Also, when using a part with height, such as an electrolytic capacitor, and disposing the rectifier circuit 4 and inverter 5 on a back surface side of the printed circuit board 11, that is, on the side opposite the surface on which the electrolytic capacitor is provided, a configuration may be such that the conductive plate 21 is configured of a first conductive plate 21a,disposed on the same side as the heatsink 30 with respect to the printed circuit board 11, and a second conductive plate 21b,disposed on the opposite side to the heatsink 30 with respect to the printed circuit board 11, and the first conductive plate 21a and second conductive plate 21bare connected by a via hole 31, as shown in FIG. 4 and FIG. 5.

According to this configuration, the noise loop 15 can be formed even when using a part with height, such as an electrolytic capacitor, and disposing the rectifier circuit 4 and inverter 5 on the side of the printed circuit board 11 opposite the surface on which the electrolytic capacitor is provided.

Third Embodiment

Figure 6:
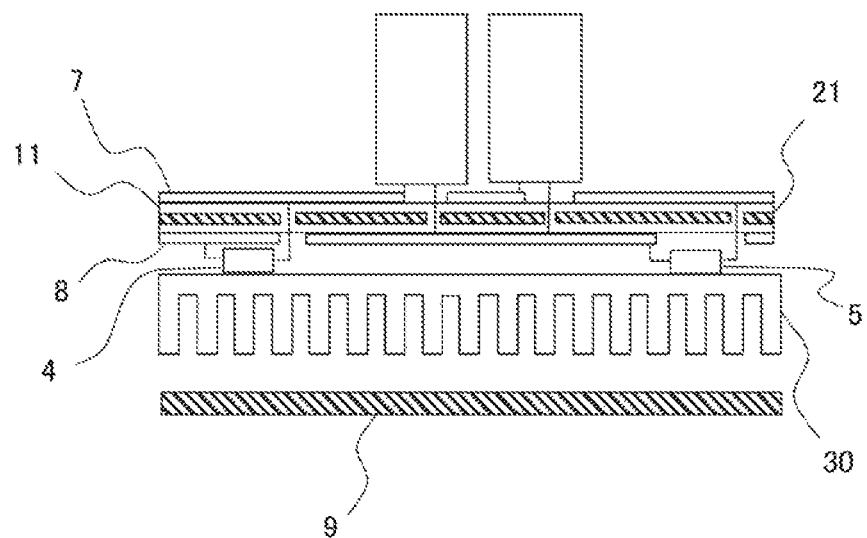
FIG. 6 is a side view of a power circuit device according to a third embodiment of the invention.

Also, a sandwich structure wherein the first wire 7 and second wire 8 are disposed so as to sandwich the conductive plate 21 from either side, as in FIG. 6, may be adopted. In this case too, the positive polarity side of the rectifier circuit 4 and the first wire 7 are connected, the negative polarity side of the rectifier circuit 4 and the second wire 8 are connected, the positive polarity side of the inverter 5 and the first wire 7 are connected, and the negative polarity side of the inverter 5 and the second wire 7 are connected. Furthermore, in the same way, the positive polarity side of the electrolytic capacitor and the first wire 7 are connected, and the negative polarity side of the electrolytic capacitor and the second wire 8 are connected.

According to this configuration, the noise loop 15 is configured of the inverter 5, an electrical wire connecting the inverter 5 and load 6, the load 6, the floating capacitance of the load 6, the ground wire terminal 22a,the ground wire 22, the conductive plate 21, the bypass capacitor 20, the rectifier circuit 4, the step-up circuit 10, and the inverter 5. In the third embodiment, inductance of the noise loop 15 can be further reduced in comparison with that in the first and second embodiments, because of which collection of noise flowing from the inverter 5 and step-up circuit 10 into the metal frame 9 via the floating capacitance of the load 6 can be carried out more efficiently. Because of this, propagation of noise flowing into the metal frame 9 via the floating capacitance of the load 6 can be restricted, and the amount of noise propagating to the system power supply 100 can be restricted.

Fourth Embodiment

Figure 7:
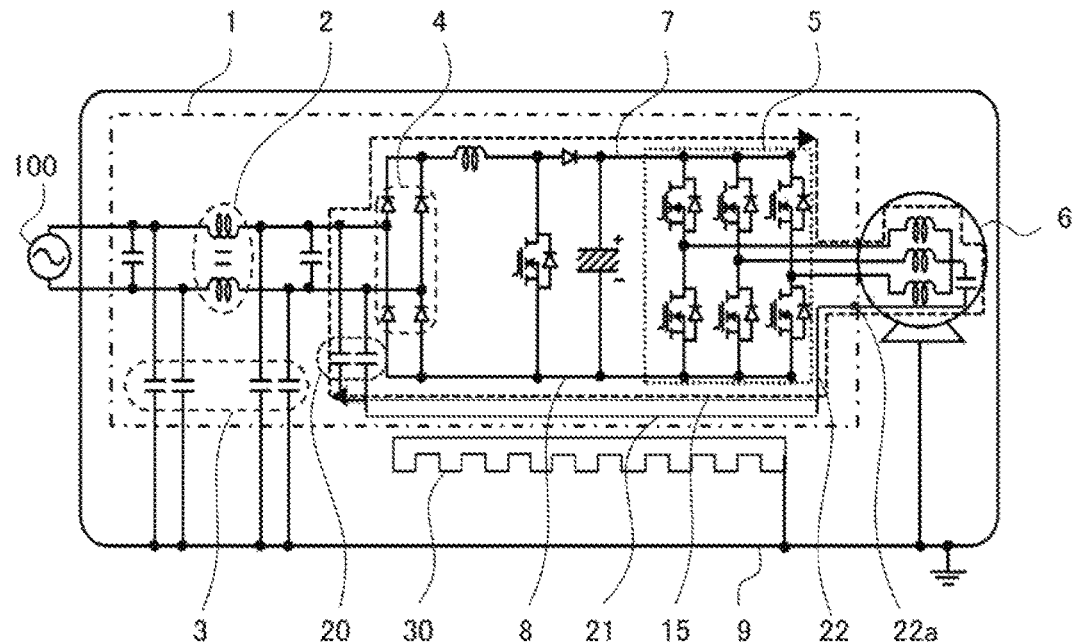
FIG. 7 is a circuit diagram of a power circuit device according to a fourth embodiment of the invention.

Also, in the first embodiment to third embodiment, a case in which the heatsink 30 is not grounded with the metal frame 9 is shown, but the heatsink 30 may be grounded with the metal frame 9, as in FIG. 7. Grounding of the heatsink 30 with the metal frame 9 is desirably carried out in one place in the vicinity of a place in which the load 6 and metal frame 9 are in contact. Also, grounding of the heatsink 30 with the conductive plate 21 can be realized by fixing with a metal screw, fixture, or the like, from the conductive plate 21 through the rectifier circuit 4 or inverter 5 to the heatsink 30.

According to this configuration, the noise loop 15 can be formed of the inverter 5, an electrical wire connecting the inverter 5 and load 6, the load 6, the floating capacitance of the load 6, the ground wire terminal 22a,the ground wire 22, the conductive plate 21, the bypass capacitor 20, the rectifier circuit 4, the step-up circuit 10, and the inverter 5, even when the heatsink 30 is grounded with the metal frame 9. The noise loop 15 of this aspect too is such that, in the same way as in the other embodiments, noise flowing from the inverter 5 and step-up circuit 10 into the metal frame 9 via the floating capacitance of the load 6 can be led, and the amount of noise flowing into the metal frame 9 via the floating capacitance of the load 6 that propagates to the system power supply 100 can be restricted.

Fifth Embodiment

Figure 8:
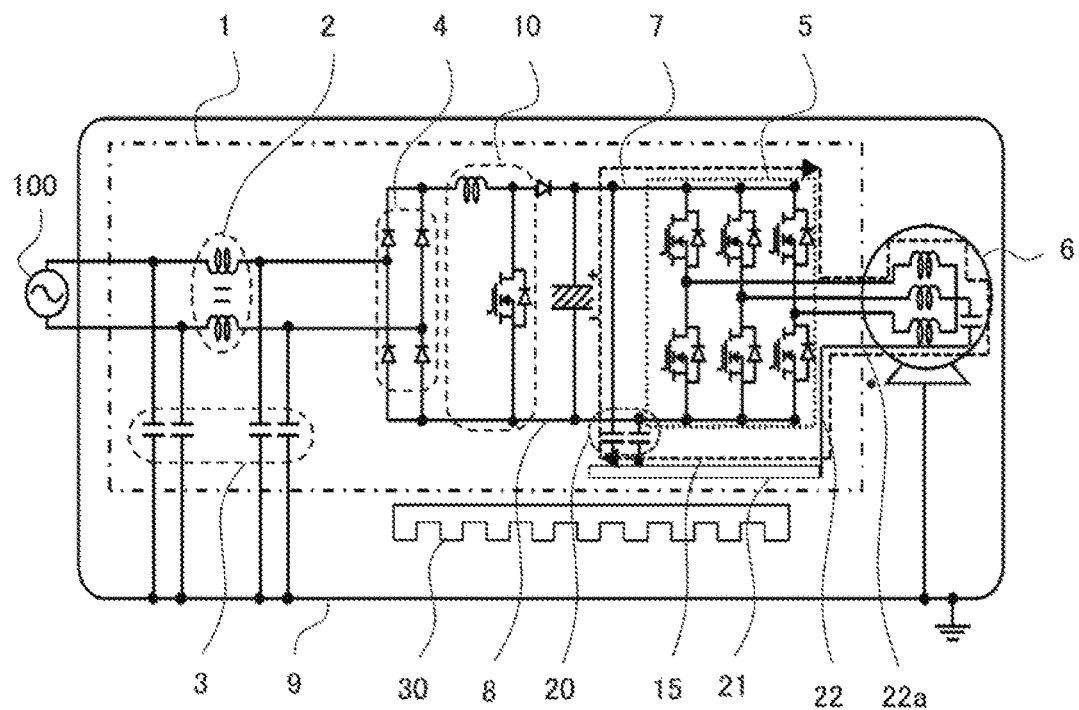
FIG. 8 is a circuit diagram of a power circuit device according to a fifth embodiment of the invention.
Figure 9:
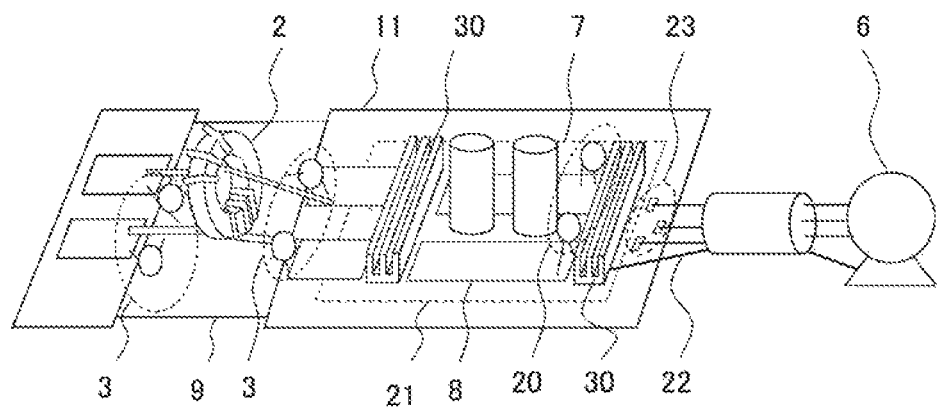
FIG. 9 is a perspective view of the power circuit device according to the fifth embodiment of the invention.

FIG. 8 is a circuit diagram showing the power circuit device 1 according to a fifth embodiment of the invention. FIG. 9 is a perspective view showing the power circuit device 1 according to the fifth embodiment of the invention. As shown in FIG. 8 and FIG. 9, the grounding capacitor 3 is disposed at either end of the common mode coil 2 in the power circuit device 1, one side of the common made coil 2 is connected to the system power supply 100, and the other is connected to the rectifier circuit 4. The rectifier circuit 4 is connected to the step-up circuit 10. The step-up circuit 10 is connected to the inverter 5 via an electrolytic capacitor, the positive polarity sides of the rectifier circuit 4, step-up circuit 10, and inverter 5 form the first wire 7, and the negative polarity sides thereof form the second wire 8. The inverter 5 is connected to the load 6, and an electrical wire of the load 6 is connected to the metal frame 9 via the floating capacitance. The load 6 is connected to the conductive plate 21 via the ground wire terminal 22a,and the inverter 5 side of the step-up circuit 10 and the conductive plate 21 are connected by the bypass capacitor 20. The heatsink 30 is provided for heat release of the rectifier circuit 4 and inverter 5, and the heatsink 30 and conductive plate 21 are disposed on a surface of the printed circuit board 11 differing from that on which the rectifier circuit 4 and inverter 5 are disposed.

According to this kind of configuration, noise flowing from the inverter 5 and step-up circuit 10 to the metal frame 9 via the floating capacitance of the load 6 is unlikely to flow into the metal frame 9 owing to the noise loop 15, and the amount of noise flowing into the metal frame from the load connected via the inverter and electrical wire that propagates to the system power supply can be restricted. The noise loop 15 can be formed even when using a part with height, such as an electrolytic capacitor, and disposing the rectifier circuit 4 and inverter 5 on the same side as the electrolytic capacitor.

The noise loop 15 is formed of the inverter 5, an electrical wire connecting the inverter 5 and load 6, the load 6, the floating capacitance of the load 6, the ground wire terminal 22a, the ground wire 22, the conductive plate 21, the bypass capacitor 20, and the inverter 5. Although a loop that passes along the first wire is shown in FIG. 8, the noise loop may be a loop that passes along the second wire 8.

By the power circuit device 1 being configured in this way, the noise loop 15, which can lead noise flowing from the step-up circuit 10 and inverter 5 into the metal frame 9 via the floating capacitance of the load 6, is provided when attempting to increase the amount of attenuation by providing the grounding capacitor 3 at either end of the common mode coil 2, because of which propagation of noise flowing into the metal frame 9 via the floating capacitance of the load 6 can be restricted, and the amount of noise propagating to the system power supply 100 can be restricted.

The ground wire 22 may be a shield of a shielded wire that links the power circuit device 1 and load 6. According to this configuration, the noise loop 15, which can lead noise flowing from the inverter 5 and step-up circuit 10 into the metal frame 9 via the floating capacitance of the load 6, is formed, and not only can the amount of noise flowing into the metal frame 9 via the floating capacitance of the load 6 that propagates to the system power supply 100 be restricted, but also noise radiating from a cable connecting the output wire 23 and load 6 can also be restricted.

Also, a diagram wherein the power circuit device 1 is enclosed by the metal frame 9 is shown in FIG. 8, but the metal frame 9 may be simply installed below the power circuit device 1, rather than enclosing the power circuit device 1.

Sixth Embodiment

Also, a case wherein the bypass capacitor 20 is connected farther to the system power supply 100 side than the rectifier circuit 4 has been described in the second embodiment, but a case wherein the inverter 5 side of the step-up circuit 10 and the conductive plate 21 are connected by the bypass capacitor 20 can be implemented as follows.

Figure 10:
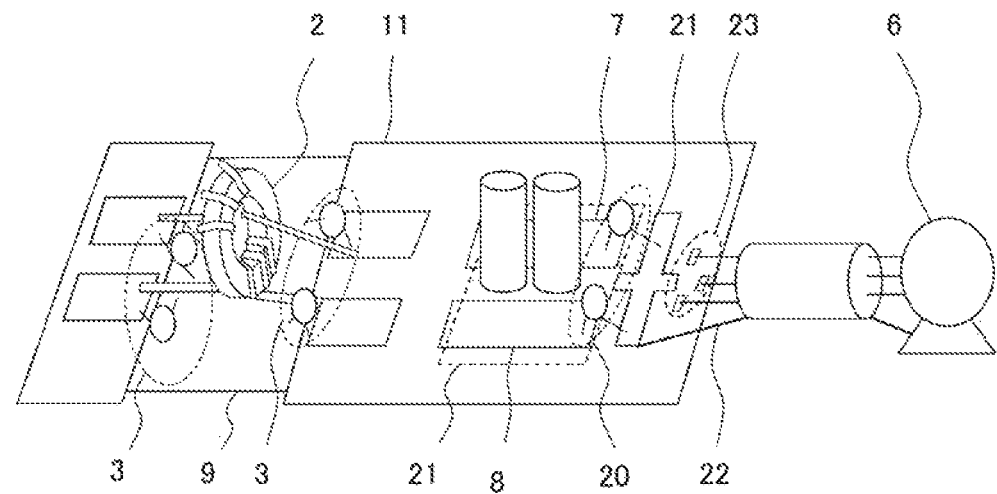
FIG. 10 is a perspective view of a power circuit device according to a sixth embodiment of the invention.

That is, when using a part with height, such as an electrolytic capacitor, and disposing the rectifier circuit 4 and inverter 5 on a surface of the printed circuit board 11 differing from that of the electrolytic capacitor, a configuration wherein the conductive plate 21 is disposed on the same side as the electrolytic capacitor is adopted, as in FIG. 10.

According to this configuration, the noise loop 15 can be formed even when using a part with height, such as an electrolytic capacitor, and disposing the rectifier circuit 4 and inverter 5 on a surface differing from that of the electrolytic capacitor.

Seventh Embodiment

Also, a case wherein the bypass capacitor 20 is connected farther to the system power supply 100 side than the rectifier circuit 4 has been described in the third embodiment, but a case wherein the inverter 5 side of the step-up circuit 10 and the conductive plate 21 are connected by the bypass capacitor 20 can be implemented as follows.

Figure 11:
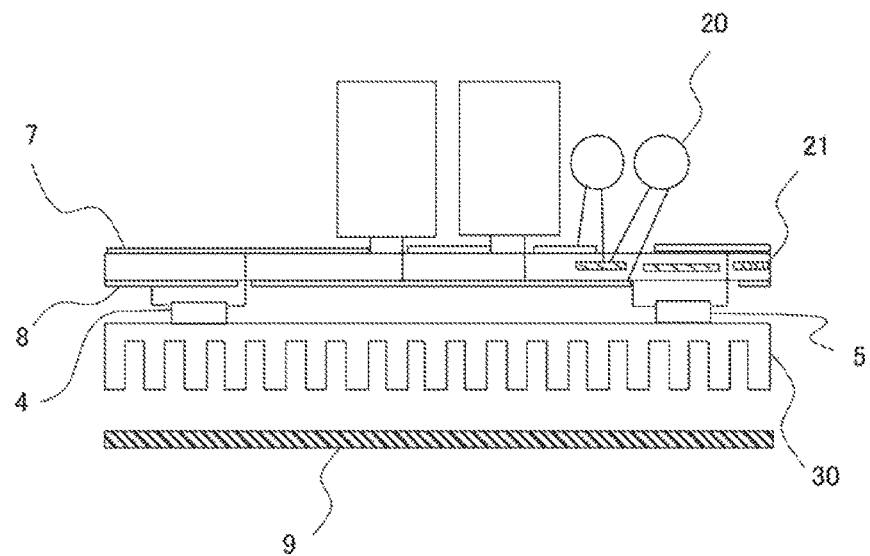
FIG. 11 is a side view of a power circuit device according to a seventh embodiment of the invention.

That is, a sandwich structure wherein the first wire 7 and second wire 8 are disposed so as to sandwich the conductive plate 21 from either side is adopted, as in FIG. 11. This structure is such that the positive polarity side of the inverter 5 and the first wire 7 are connected, and the negative polarity side of the inverter 5 and the second wire 8 are connected. Furthermore, in the same way, the positive polarity side of the electrolytic capacitor and the first wire 7 are connected, and the negative polarity side of the electrolytic capacitor and the second wire 8 are connected.

According to this configuration, the noise loop 15 is configured of the inverter 5, an electrical wire connecting the inverter 5 and load 6, the load 6, the floating capacitance of the load 6, the ground wire terminal 22a, the ground wire 22, the conductive plate 21, the bypass capacitor 20, and the inverter 5, and inductance of the noise loop 15 can be further reduced in comparison with that in the fifth embodiment and sixth embodiment, because of which noise flowing into the metal frame 9 via the floating capacitance of the load 6 can be led by the noise loop 15, and the amount of noise propagating from the metal frame 9 to the system power supply 100 can be restricted.

Eighth Embodiment

Figure 12:
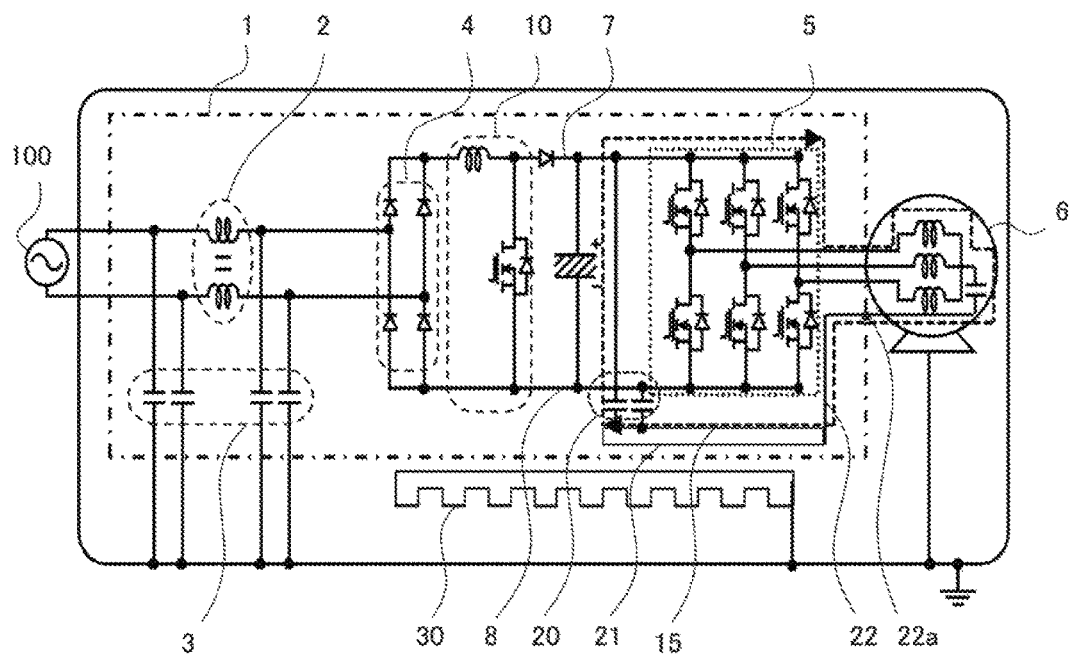
FIG. 12 is a circuit diagram of a power circuit device according to an eighth embodiment of the invention.

Also, in the fifth embodiment to seventh embodiment, a case in which the heatsink 30 is not grounded with the metal frame 9 is shown, but in the same way as that shown in FIG. 7 of the fourth embodiment, the heatsink 30 may be grounded with the metal frame 9, as in FIG. 12. Grounding of the heatsink 30 with the metal frame 9 is desirably carried out in one place in the vicinity of a place in which the load 6 and metal frame 9 are in contact. Also, grounding of the heatsink 30 with the conductive plate 21 can be realized by fixing with a metal screw, fixture, or the like, from the conductive plate 21 through the rectifier circuit 4 or inverter 5 to the heatsink.

According to this configuration, even when the heatsink 30 is grounded, the noise loop 15 formed of the inverter 5, an electrical wire connecting the inverter and load, the load 6, the floating capacitance of the load 6, the ground wire 22, the conductive plate 21, the bypass capacitor 20, and the inverter 5 can be formed, noise flowing from the inverter 5 and step-up circuit 10 into the metal frame 3 via the floating capacitance of the load 6 can be led by the noise loop 15, propagation of noise flowing into the metal frame 9 is restricted, and the amount of noise propagating to the system power supply 100 can be restricted.

Ninth Embodiment

Figure 13:
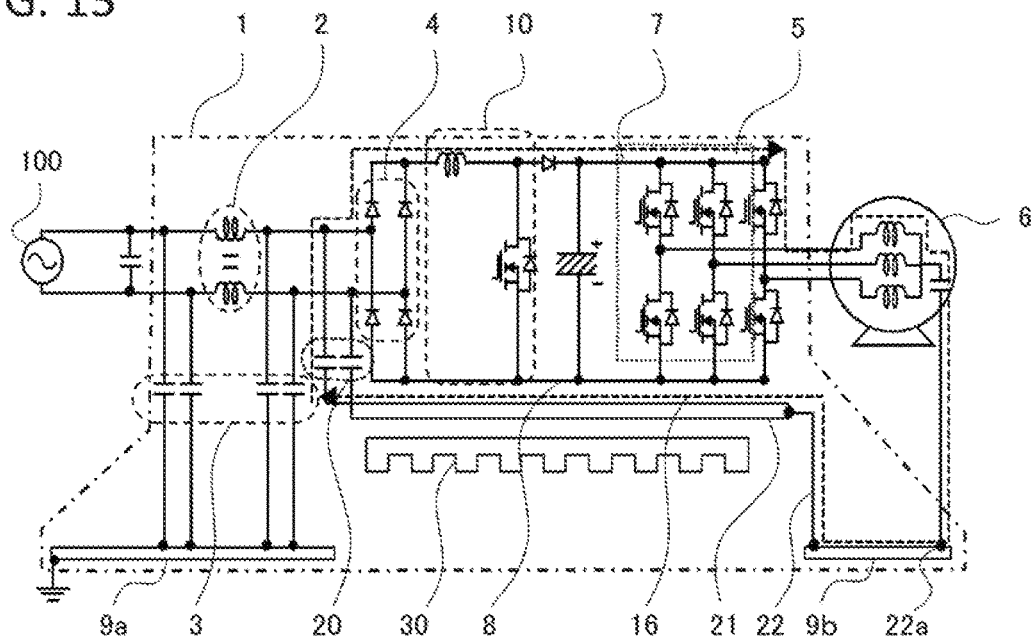
FIG. 13 is a circuit diagram of a power circuit device according to a ninth embodiment of the invention.

FIG. 13 is a circuit diagram showing the power circuit device 1 according to the ninth embodiment of the invention. As shown in FIG. 13, the power circuit device 1 is such that the metal frame 9 shown in FIG. 8 is divided into a first metal frame 9a and a second metal frame 9b. The first metal frame 9a and second metal frame 9b are not electrically connected, but the second metal frame 9b is connected to the ground wire terminal 22a.

According to this kind of configuration, noise flowing from the inverter 5 and step-up circuit 10 into the second metal frame 9b via the floating capacitance of the load 6 is unlikely to flow into the first metal frame 9a owing to a noise loop 16, and the amount of noise propagating to the system power supply can be restricted.

The noise loop 16 is formed of the inverter 5, an electrical wire connecting the inverter 5 and load 6, the load 6, the floating capacitance of the load 6, the ground wire terminal 22a, the second metal frame 9b, the ground wire 22, the conductive plate 21, the bypass capacitor 20, and the inverter 5.

Although a loop that passes along the first wire 7 is shown in FIG. 13, the noise loop 16 may be a loop that passes along the second wire 8. Also, the bypass capacitor 20 may be disposed on the inverter 5 side of the rectifier circuit 4, in which case the noise loop 16 is formed of the inverter 5, an electrical wire connecting the inverter 5 and load 6, the load 6, the floating capacitance of the load 6, the ground wire terminal 22a, the second metal frame 9b, the ground wire 22, the conductive plate 21, the bypass capacitor 20, and the inverter 5.

By the power circuit device 1 being configured in this way, the noise loop 16, which can lead noise flowing from the step-up circuit 10 and inverter 5 into the metal frame 9 via the floating capacitance of the load 6, is provided when attempting to increase as amount of attenuation by providing the grounding capacitor 3 at either end of the common mode coil 2, because of which propagation of noise flowing into the first metal frame 9a and system power supply 100 via the floating capacitance of the load 6, the ground wire terminal 22a, the second metal frame 9b, the ground wire 22, and the conductive plate 21 can be restricted, and the amount of noise propagating to the system power supply 100 can be restricted.

Also, the ground wire 22 may be a shield of a shielded wire that links the power circuit device 1 and load 6. According to this configuration, the noise loop 16, which can lead noise flowing from the inverter 5 and step-up circuit 10 into the second metal frame 9b via the floating capacitance of the load 6, is formed, and not only can the amount of noise flowing into the second metal frame 9b via the floating capacitance of the load 6 that propagates to the system power supply 100 be restricted, but also noise radiating from a cable connecting the inverter 5 and load 6 can also be restricted.

Also, a diagram wherein the first metal frame 9a and second metal frame 9b are installed below the power circuit device 1 is shown in FIG. 13, but the first metal frame 9a and second metal frame 9b may enclose the power circuit device 1.

Also, in the ninth embodiment, a case in which the heatsink 30 is not grounded with the metal frame 9 is shown, but the heatsink 30 may be grounded with the first metal frame 9a or second metal frame 9b. Grounding of the heatsink 30 with the first metal frame 9a or second metal frame 9b is desirably carried out in one place in the vicinity of a place in which the load 6 and first metal frame 9a or second metal frame 9b are in contact. Also, grounding of the heatsink 30 with the conductive plate 21 can be realized by fixing with a metal screw, fixture, or the like, from the conductive plate 21 through the rectifier circuit 4 or inverter 5 to the heatsink 30.

Tenth Embodiment

Figure 14:
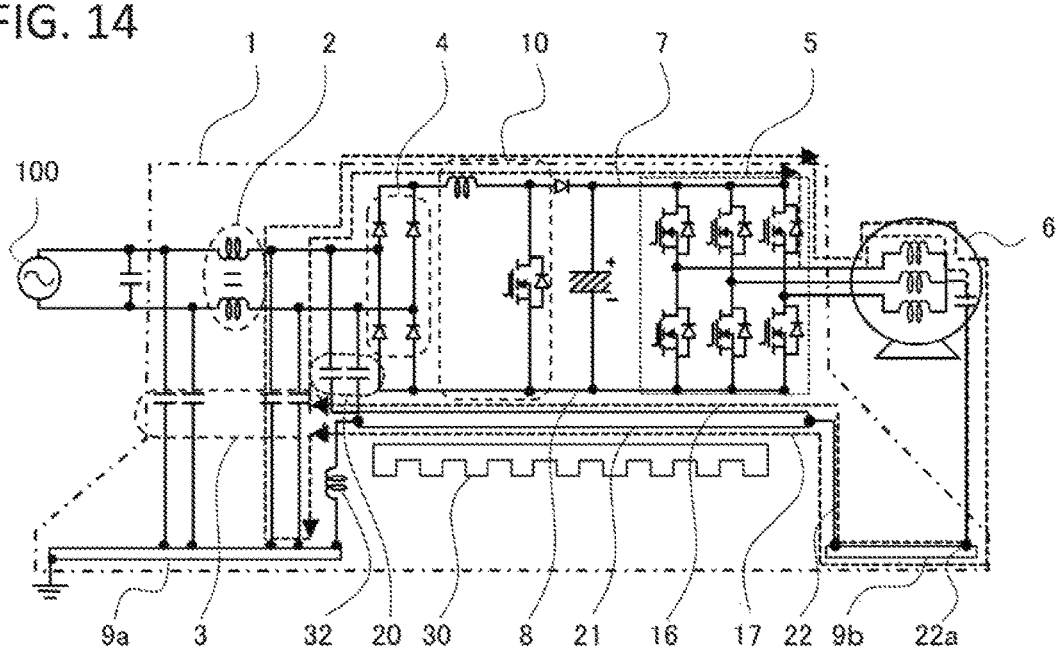
FIG. 14 is a circuit diagram of a power circuit device according to a tenth embodiment of the invention.

A case wherein the first metal frame 9a and second metal frame 9b are not electrically connected is shown in FIG. 13, but the conductive plate 21 and first metal frame 9a may be connected by an inductor 32, and the conductive plate 21 and second metal frame 9b connected by the around wire 22, as in FIG. 14. In this case, a value of the inductor 32 is determined so that impedance of a noise loop 17 is higher than that of the noise loop 16.

The noise loop 16 is formed of the inverter 5, an electrical wire connecting the inverter 5 and load 6, the load 6, the floating capacitance of the load 6, the ground wire terminal 22a, the second metal frame 9b, the ground wire 22, the conductive plate 21, the bypass capacitor 20, and the inverter 5. Also, the noise loop 17 is formed of the inverter 5, an electrical wire connecting the inverter 5 and load 6, the load 6, the floating capacitance of the load 6, the ground wire terminal 22a, the second metal frame 9b, the ground wire 22, the conductive plate 21, the inductor 32, the first metal frame 9a, the grounding capacitor 3, the rectifier circuit 4, and the inverter 5.

Although a loop that passes along the first wire 7 is shown in FIG. 14, the noise loop may be a loop that passes along the second wire 8. Also, the bypass capacitor 20 may be disposed on the inverter 5 side of the rectifier circuit 4, in which case the noise loop 16 is formed of the inverter 5, an electrical wire connecting the inverter 5 and load 6, the load 6, the floating capacitance of the load 6, the ground wire terminal 22a, the second metal frame 9b, the ground wire 22, the conductive plate 21, the bypass capacitor 20, and the inverter 5.

By the power circuit device 1 being configured in this way, the noise loop 16, which can lead noise flowing from the step-up circuit 10 and inverter 5 into the second metal frame 9b via the floating capacitance of the load 6, is provided when attempting to increase an amount of attenuation by providing the grounding capacitor 3 at either end of the common mode coil 2, because of which propagation of noise flowing into the first metal frame 9a and system power supply 100 via the floating capacitance of the load 6, the ground wire terminal 22a, the second metal frame 9b, the ground wire 22, and the conductive plate 21 can be restricted, and the amount of noise propagating to the system power supply 100 can be restricted.

Also, the ground wire 22 may be a shield of a shielded wire that links the power circuit device 1 and load 6.

According to this configuration, the noise loop 16, which can lead noise flowing from the inverter 5 and step-up circuit 10 into the second metal frame 9b via the floating capacitance of the load 6, is formed, and not only can the amount of noise flowing into the second metal frame 9b via the floating capacitance of the load 6 that propagates to the system power supply 100 be restricted, but also noise radiating from a cable connecting the inverter 5 and load 6 can also be restricted.

Also, a diagram wherein the first metal frame 9a and second metal frame 9b are installed below the power circuit device 1 is shown in FIG. 14, but the first metal frame 9a and second metal frame 9b may enclose the power circuit device 1.

Also, in the tenth embodiment, a case in which the heatsink 30 is not grounded with the metal frame 9 is shown, but the heatsink 30 may be grounded with the first metal frame 9a or second metal frame 9b. Grounding of the heatsink 30 with the first metal frame 9a or second metal frame 9b is desirably carried out in one place in the vicinity of a place in which the load 6 and first metal frame 9a or second metal frame 9b are in contact. Also, grounding of the heatsink 30 with the conductive plate 21 can be realized by fixing with a metal screw, fixture, or the like, from the conductive plate 21 through the rectifier circuit 4 or inverter 5 to the heatsink 30.

Eleventh Embodiment

Figure 15:
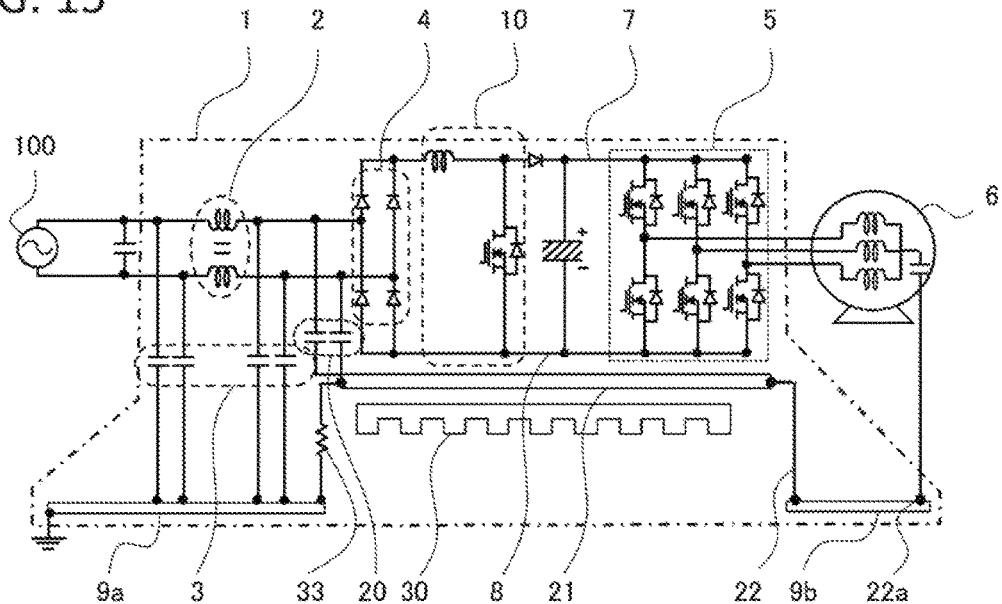
FIG. 15 is a circuit diagram of a power circuit device according to an eleventh embodiment of the invention.

A case wherein the first metal frame 9a and second metal frame 9b are not electrically connected is shown in FIG. 13, but the conductive plate 21 and first metal frame 9a may be connected by resistance 33, and the conductive plate 21 and second metal frame 9b connected by the ground wire 22, as in FIG. 15. In this case, a value of the resistance 33 is determined so that impedance of the noise loop 17 is higher than that of the noise loop 16, as shown in FIG. 14 in the tenth embodiment.

Twelfth Embodiment

Figure 16:
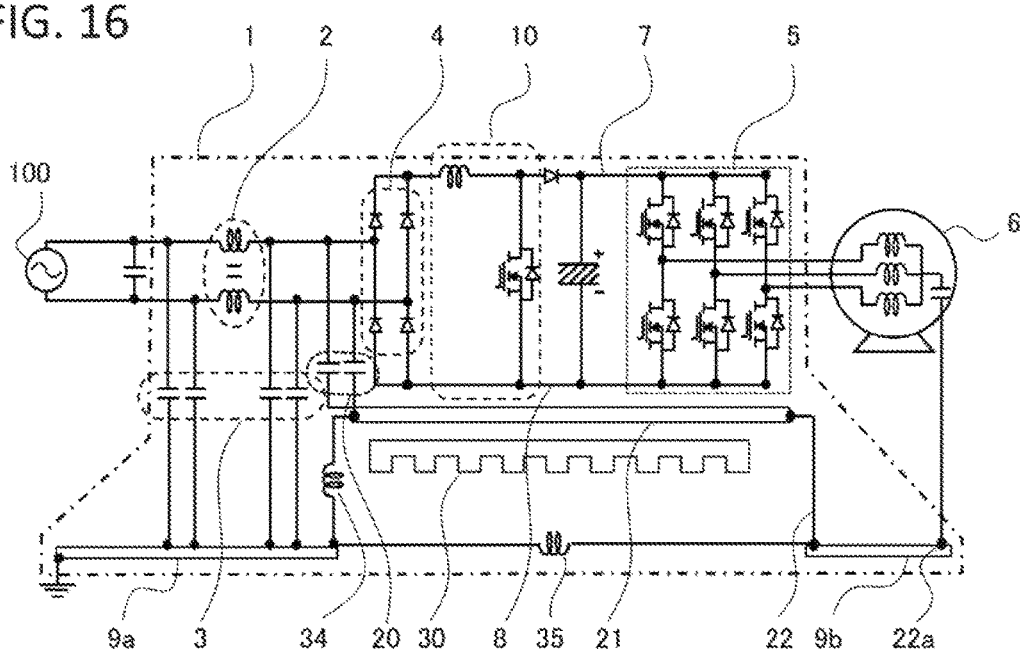
FIG. 16 is a circuit diagram of a power circuit device according to a twelfth embodiment of the invention.

FIG. 16 is a circuit diagram showing the power circuit device 1 according to the twelfth embodiment of the invention. The conductive plate 21 and first metal frame 9a are connected by a first inductor 34, the conductive plate 21 and second metal frame 9b are connected by the ground wire 22, and furthermore, the first metal frame 9a and second metal frame 9b are connected by a second inductor 35. The bypass capacitor 20 may be disposed on the inverter 5 side of the rectifier circuit 4.

By the power circuit device 1 being configured in this way, the amount of propagation of noise flowing from the step-up circuit 10 and inverter 5 via the floating capacitance of the load 6, the ground wire terminal 22a, the second metal frame 9b, the ground wire 22, and the conductive plate 21, or from the step-up circuit 10 and inverter 5 via the floating capacitance of the load 6, the ground wire terminal 22a, the second metal frame 9b, and the second inductor 35, into the first metal frame 9a and system power supply 100 can be restricted when attempting to increase the amount of attenuation by providing the grounding capacitor 3 at either end of the common mode coil 2.

The ground wire 22 may be a shield of a shielded wire that links the power circuit device 1 and load 6. According to this configuration, the noise loop 16, which can lead noise flowing from the inverter 5 and step-up circuit 10 into the second metal frame 9b via the floating capacitance of the load 6, is formed, and not only can the amount of noise flowing into the second metal frame 9b via the floating capacitance of the load 6 that, propagates to the system power supply 100 be restricted, but also noise radiating from a cable connecting the inverter 5 and load 6 can also be restricted.

Also, a diagram wherein the first metal frame 9a and second metal frame 9b are installed below the power circuit device 1 is shown in FIG. 16, but the first metal frame 9a and second metal frame 9b may enclose the power circuit device 1.

Also, in the twelfth embodiment, a case in which the heatsink 30 is not grounded with the metal frame 9 is shown, but the heatsink 30 may be grounded with the first metal frame 9a or second metal frame 9b. Grounding of the heatsink 30 with the first metal frame 9a or second metal frame 9b is desirably carried out in one place in the vicinity of a place in which the load 6 and first metal frame 9a or second metal frame 9b are in contact. Also, grounding of the heatsink 30 with the conductive plate 21 can be realized by fixing with a metal screw, fixture, or the like, from the conductive plate 21 through the rectifier circuit 4 or inverter 5 to the heatsink 30.

Thirteenth Embodiment

Figure 17:
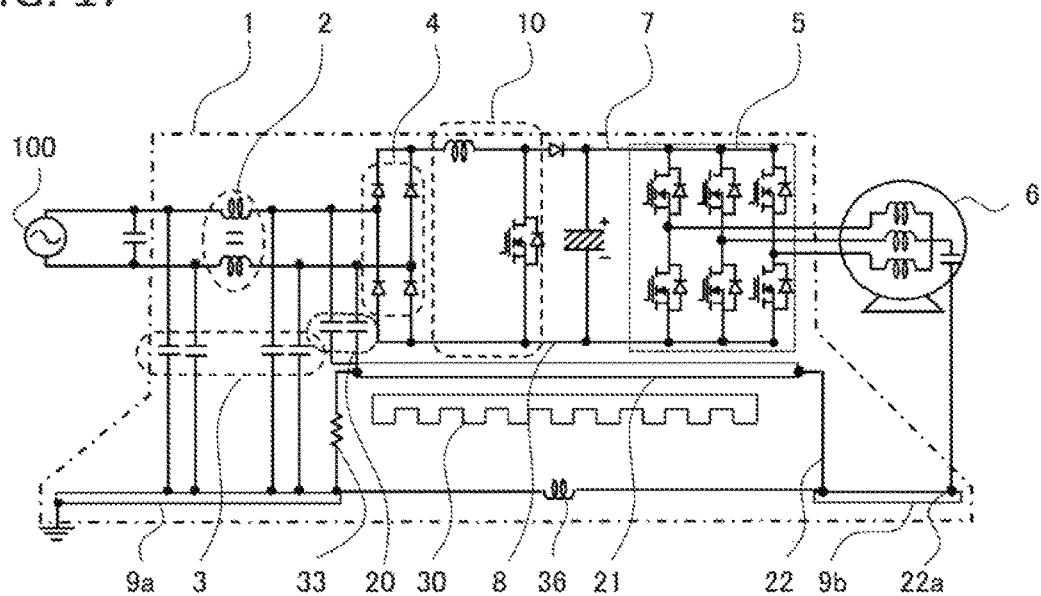
FIG. 17 is a circuit diagram of a power circuit device according to a thirteenth embodiment of the invention.

A case wherein the conductive plate 21 and first metal frame 9a are connected by the first inductor 34 is shown in FIG. 16, but the conductive plate 2 and first metal frame 9a may be connected by the resistance 33, the first metal frame 9a and second metal frame 9b connected by an inductor, and the conductive plate 21 and second metal frame 9b connected by the ground wire 22, as in FIG. 17.

By the power circuit device 1 being configured in this way, the amount of propagation of noise flowing from the step-up circuit 10 and inverter 5 via the floating capacitance of the load 6, the ground wire terminal 22a, the second metal frame 9b, the ground wire 22, and the conductive plate 21, or from the step-up circuit 10 and inverter 5 via the floating capacitance of the load 6, the ground wire terminal 22a, the second, metal frame 9b, and an inductor 36, into the first metal frame 9a and system power supply 100 can be restricted when attempting to increase the amount of attenuation by providing the grounding capacitor 3 at either end of the common mode coil 2.

Fourteenth Embodiment

Figure 18:
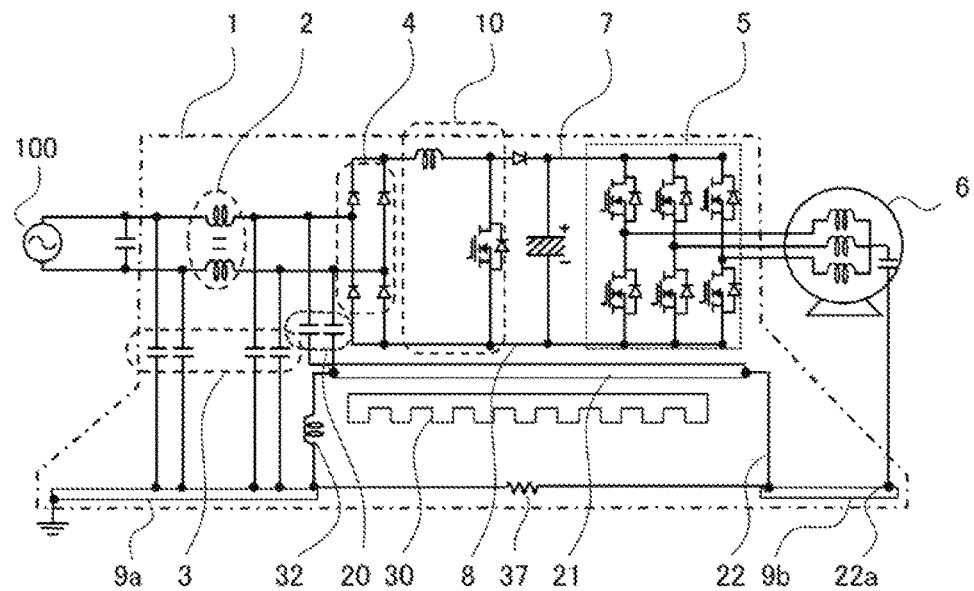
FIG. 18 is a circuit diagram of a power circuit device according to a fourteenth embodiment of the invention.

A case wherein the first metal frame 9a and second metal frame 9b are connected by the second inductor 35 is shown in FIG. 16, but the conductive plate 21 and first metal frame 9a may be connected by the inductor 32, the first metal frame 9a and second metal frame 9b connected by resistance 37, and the conductive plate 21 and second metal frame 9b connected by the ground wire 22, as in FIG. 18.

By the power circuit device 1 being configured in this way, the amount of propagation of noise flowing from the step-up circuit 10 and inverter 5 via the floating capacitance of the load 6, the ground wire terminal 22a, the second metal frame 9b, the ground wire 22, and the conductive plate 21, or from the step-up circuit 10 and inverter 5 via the floating capacitance of the load 6, the ground wire terminal 22a, the second metal frame 9b, and the resistance 37, into the first metal frame 9a and system power supply 100 can be restricted when attempting to increase the amount of attenuation by providing the grounding capacitor 3 at either end of the common mode coil 2.

Fifteenth Embodiment

Figure 19:
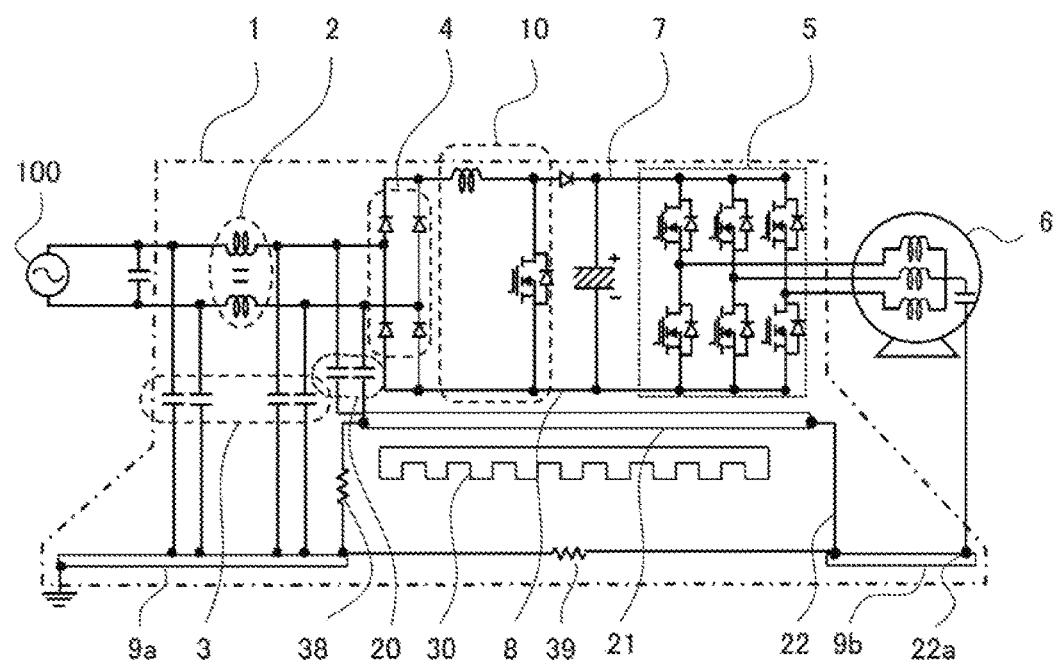
FIG. 19 is a circuit diagram of a power circuit device according to a fifteenth embodiment of the invention.

A case wherein the first metal frame 9a and second metal frame 9b are connected by the second inductor 35 and the conductive plate 21 and first metal frame 9a are connected by the first inductor 34 is shown in FIG. 16, but the conductive plate 21 and first metal frame 9a may be connected by first resistance 38, the first metal frame 9a and second metal frame 9b connected by second resistance 39, and the conductive plate 21 and second metal frame 9b connected by the ground wire 22, as in FIG. 19.

By the power circuit device 1 being configured in this way, the amount of propagation of noise flowing from the step-up circuit 10 and inverter 5 via the floating capacitance of the load 6, the ground wire terminal 22a, the second metal frame 9b, the ground wire 22, end the conductive plate 21, or from the step-up circuit 10 and inverter 5 via the floating capacitance of the load 6, the ground wire terminal 22a, the second metal frame 9b, and the second resistance 39, into the first metal frame 9a and system power supply 100 can be restricted when attempting to increase the amount of attenuation by providing the grounding capacitor 3 at either end of the common mode coil 2.

The embodiments can be freely combined, and each embodiment can be modified or abbreviated as appropriate, without departing from the scope of the invention.

The invention claimed is:

1. A power circuit device, comprising:
   a rectifier circuit;
   an inverter;
   a common mode coil provided on an input side of the rectifier circuit;

a first electrical circuit that connects the common mode coil, a positive polarity side of the rectifier circuit, and the inverter;

a second electrical circuit that connects the common mode coil, a negative polarity side of the rectifier circuit, and the inverter;

a conductive plate;

a plurality of bypass capacitors connected between the first electrical circuit and second electrical circuit and the conductive plate;

a ground wire terminal that connects a load connected to an output terminal of the inverter to a ground potential; and a metal frame, wherein the metal frame includes a first metal frame and a second metal frame, the first metal frame and the second metal frame having no direct electrical connection, the first metal frame is connected to the conductive plate by an inductor or resistance, the second metal frame is connected to the ground wire terminal, and a noise loop is formed of at least one of the first electrical circuit and second electrical circuit, the plurality of bypass capacitors, the conductive plate, and the ground wire terminal.

2. The power circuit device according to claim 1, wherein the plurality of bypass capacitors are connected between the rectifier circuit and common mode coil.

3. The power circuit device according to claim 2, wherein the rectifier circuit and inverter have a heatsink, the rectifier circuit, inverter, and heatsink are mounted on a printed circuit board, the conductive plate is configured of a first conductive plate, which is disposed on a surface of the printed circuit board on a side the same as a side on which the heatsink is mounted, and a second conductive plate, which is disposed on a surface of the printed circuit board on a side opposite to the side on which the heatsink is mounted, and the first conductive plate and second conductive plate are connected by a via hole.

4. The power circuit device according to claim 1, wherein the plurality of bypass capacitors are connected between the rectifier circuit and inverter.

5. The power circuit device according to claim 4, wherein the rectifier circuit and inverter have a heatsink, the rectifier circuit, inverter, and heatsink are mounted on a printed circuit board, the conductive plate is configured of a first conductive plate, which is disposed on a surface of the printed circuit board on a side the same as a side on which the heatsink is mounted, and a second conductive plate, which is disposed on a surface of the printed circuit board on a side opposite to the side on which the heatsink is mounted, and the first conductive plate and second conductive plate are connected by a via hole.

6. The power circuit device according to claim 1, wherein the rectifier circuit and inverter have a heatsink, the rectifier circuit, inverter, and heatsink are mounted on a printed circuit board, the conductive plate is configured of a first conductive plate, which is disposed on a surface of the printed circuit board on a side the same as a side on which the heatsink is mounted, and a second conductive plate, which is disposed on a surface of the printed circuit board on a side opposite to the side on which the heatsink is mounted, and the first conductive plate and second conductive plate are connected by a via hole.

* * * * *